(12) United States Patent
McGaha

(10) Patent No.: US 6,844,741 B2
(45) Date of Patent: Jan. 18, 2005

(54) METHOD AND SYSTEM FOR ELECTRICAL LENGTH MATCHING

(75) Inventor: Carl Edward McGaha, Terrell, TX (US)

(73) Assignee: Raytheon Company, Waltham, MA (US)

( * ) Notice: Subject to any disclaimer, the term of this patent is extended or adjusted under 35 U.S.C. 154(b) by 143 days.

(21) Appl. No.: 10/370,877

(22) Filed: Feb. 20, 2003

(65) Prior Publication Data
US 2004/0164747 A1 Aug. 26, 2004

(51) Int. Cl.[7] .......................... G01R 27/04; G01R 27/28
(52) U.S. Cl. ...................................... 324/644; 324/615
(58) Field of Search ................................. 324/644, 642, 324/637, 629, 600, 520, 512, 500, 765, 537, 233, 236, 615, 616, 617, 532, 535; 702/58, 59, 65, 155, 158, 159; 340/524, 525; 375/233

(56) References Cited

U.S. PATENT DOCUMENTS

| 4,919,030 A | * | 4/1990 | Perron, III | 84/470 R |
| 5,245,291 A | * | 9/1993 | Fujimura | 324/617 |
| 5,311,440 A | * | 5/1994 | Hess, Jr. | 324/615 |
| 5,319,353 A | * | 6/1994 | Ohnishi et al. | 340/525 |
| 5,495,170 A | | 2/1996 | Feeney et al. | 324/236 |
| 5,508,610 A | | 4/1996 | Feeney et al. | 324/233 |
| 5,977,773 A | | 11/1999 | Medelius et al. | 324/520 |
| 6,259,258 B1 | * | 7/2001 | Cook et al. | 324/628 |
| 6,369,601 B1 | | 4/2002 | Ishigaki | 324/765 |
| 6,438,163 B1 | * | 8/2002 | Raghavan et al. | 375/233 |

FOREIGN PATENT DOCUMENTS

EP    0 457 739 A1    11/1991    ............ G01B/7/04

OTHER PUBLICATIONS

PCT Notification of Transmittal of the International Search Report or the Declaration, mailed Nov. 5, 2004, including International Search Report re PCT/US 03/39755 (6 pgs).

* cited by examiner

Primary Examiner—Jay Patidar
Assistant Examiner—Hoai-An D. Nguyen
(74) Attorney, Agent, or Firm—Baker Botts L.L.P.

(57) ABSTRACT

According to one embodiment of the invention, a computerized method for tuning a wire to have a particular electrical length is provided. The method includes providing a reference wire and the wire to be tuned. The method also includes transmitting a reference signal and a test signal over the reference wire and the wire, respectively, to a destination. The method also includes determining the time difference between arrival of the respective signals at the destination. The method also includes providing, based on the time difference, an indication of the location along the length of the wire where the wire has an electrical length approximately equal to the electrical length of the reference wire.

20 Claims, 3 Drawing Sheets

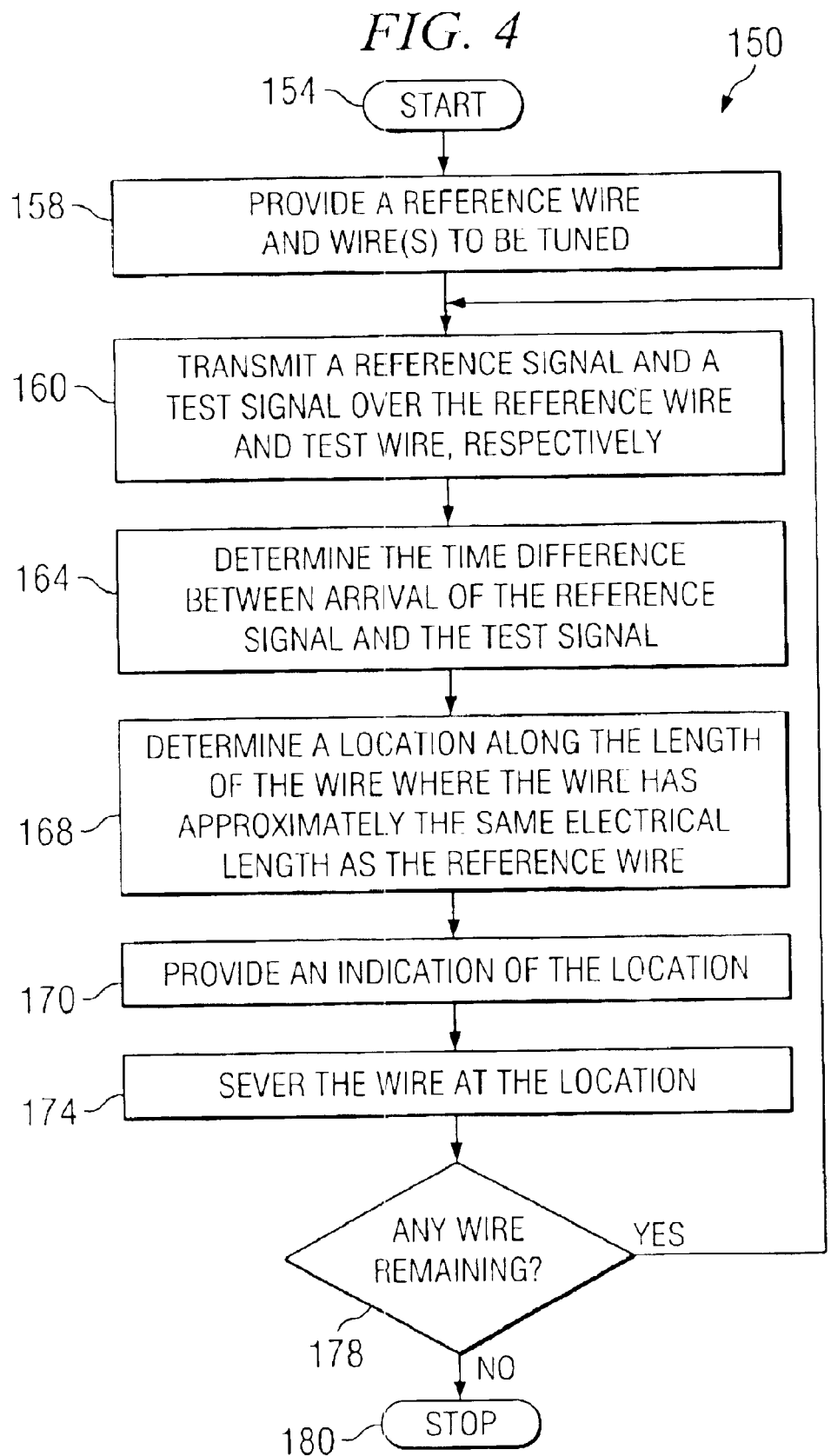

US 6,844,741 B2

METHOD AND SYSTEM FOR ELECTRICAL LENGTH MATCHING

TECHNICAL FIELD OF THE INVENTION

This invention relates generally to electrical devices and more particularly to a method and system for electrical length matching.

BACKGROUND OF THE INVENTION

Many sophisticated electronic devices may require signals carried by different wires to reach a particular destination at substantially the same time. Such wires are commonly referred to as having the same "electrical length." To provide wires having the same electrical length, the wires may be cut to have the same physical length. However, this method is acceptable if each wire has a relatively constant physical length and approximately the same rate of signal propagation. Where wires do not meet such conditions, a designer may adjust or "tune" the physical length of each wire so that the wires have the same electrical length. Such a process may be referred to as "electrical length matching."

A conventional electrical length matching process may require a significant amount of time and extensive manual labor. For example, a technician tuning a set of wires may be required to tune each wire separately. For each wire, the technician transmits a signal from one end of the wire and measures the arrival time of the signal at the other end of the wire. If the measured arrival time is longer than a known signal arrival time of a predetermined electrical length, then an increment of the wire is removed. Then the technician repeats this process until the measured signal arrival time for the wire is approximately equal to the known signal arrival time of the predetermined electrical length.

SUMMARY OF THE INVENTION

According to one embodiment of the invention, a computerized method for tuning a wire to have a particular electrical length is provided. The method includes providing a reference wire and the wire to be tuned. The method also includes transmitting a reference signal and a test signal over the reference wire and the wire, respectively, to a destination. The method also includes determining the time difference between arrival of the respective signals at the destination. The method also includes providing, based on the time difference, an indication of the location along the length of the wire where the wire has an electrical length approximately equal to the electrical length of the reference wire.

Some embodiments of the invention provide numerous technical advantages. Other embodiments may realize some, none, or all of these advantages. For example, according to one embodiment, the time and cost of providing a set of wires having approximately the same electrical length may be reduced. According to another embodiment, lower quality wires may be used to provide a set of wires having an approximately the same electrical length.

Other advantages may be readily ascertainable by those skilled in the art.

BRIEF DESCRIPTION OF THE DRAWINGS

Reference is now made to the following description taken in conjunction with the accompanying drawings, wherein like reference numbers represent like parts, in which:

FIG. 4 is a flow chart illustrating one embodiment of a method of electrical length matching.

DETAILED DESCRIPTION OF EXAMPLE EMBODIMENTS OF THE INVENTION

Embodiments of the invention are best understood by referring to FIGS. 1A through 4 of the drawings, like numerals being used for like and corresponding parts of the various drawings.

Figure 1A:
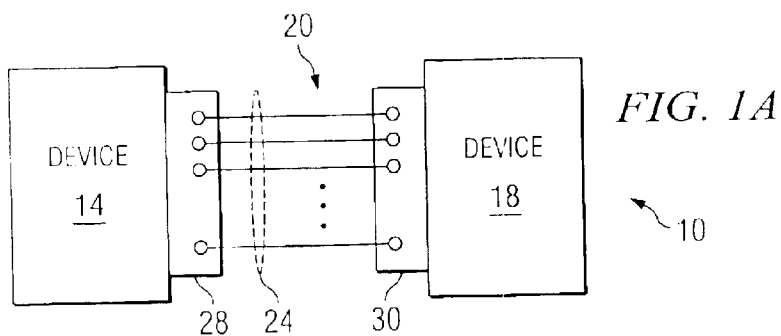
FIG. 1A is a schematic diagram illustrating one embodiment of a system that may benefit from the teachings of the present invention.

FIG. 1A is a schematic diagram illustrating one embodiment of a system 10 that may benefit from the teachings of the present invention. System 10 comprises a device 14, a device 18, and a connection assembly 20. Devices 14 and 18 may be any electronic device that may be operable to communicate with each other by transmitting a plurality of signals. Connection assembly 20 comprises a plurality of wires 24, a connector 28 and a connector 30. Connectors 28 and 30 are coupled to the respective ends of wires 24, as shown in FIG. 1A. Devices 14 and 18 are coupled to each other by connection assembly 20. For example, devices 14 and 18 may each have a port (not explicitly shown) that may be configured to receive connector 28 and/or connector 30. Each wire 24 is operable to carry signals to and from device 14 and device 18.

Some electronic systems may have a design requirement for a set of signals to reach a destination at approximately the same time. For example, where device 14 is a digital switch matrix and device 18 is a signal processing box, a plurality of signals each transmitted over respective wires 24 may be required to reach device 14 or device 18 at the same time for system 10 to operate properly. To enable wires 24 to carry the respective signals so that the signals may reach device 18 at the same time, the respective electrical lengths of wires 24 may need to be the same. An "electrical length" refers to a distance that a signal travels from one end of a wire to another end of the wire in a given time period. Changing the physical length of a wire does not necessarily change the electrical length of the wire. For example, stretching a piece of twisted pair wire to physically lengthen the wire would not necessarily change the electrical length of the wire. Because wires having the same physical length may not have the same electrical length, each wire may need to be tuned so that the wires have the same electrical length. For example, twisted pair wires, which may change in physical length because of its inherent ability to stretch may require electrical length tuning. One example of a twisted pair wire is a category 5 twisted pair cable.

To provide a set of wires for system 10, wires having a pre-measured electrical length may be used. For example, pieces of wire having the same electrical length may be cut from a wire that has a consistent physical length. In case of a twisted pair wire, the wire may be laid out so that the amount of stretch is relatively consistent throughout the length of the wire. Then the wire may be cut in equal physical lengths to match the electrical lengths. Cutting such wire into equal physical lengths may provide pieces of wire having equal electrical lengths, provided that the material forming the wire has approximately the same rate of signal propagation and the amount of stretch throughout the length of the wire is relatively consistent. However, purchasing these wires to use in conjunction with system 10 may be expensive for a manufacturer of system 10. Alternatively, the manufacturers may use their own wires rather than purchasing the wires having a known electrical length from a separate vendor. However, each wire used to connect the devices may require tuning so that all of the wires have the same electrical length. Such a process may require a significant amount of time and intensive manual labor. For example, to tune each wire 24 of system 10, a signal may be transmitted from one end of wire 24 to the other end of wire 24. Then the time of travel over the wire 24 is measured to determine whether the wire has the desired electrical length. If the measured time is longer than the time associated with a desired electrical length, then an increment of the wire 24 is removed. Then the time of travel for another signal is measured for the same wire 24 to determine whether the adjusted wire 24 has the desired electrical length. This process is repeated until the wire 24 has the desired electrical length. Such a process requires intensive manual labor and is prone to costly errors. For example, a technician may remove too much wire, which would required the technician to restart the entire process with a new wire. Although a manufacturer may save money by not purchasing a set of wires having a known electrical length, the amount of savings may be offset by the cost of tuning each wire of a system.

According to one embodiment of the present invention, an improved system and method of wire tuning are provided. According to one embodiment, the time and cost of providing a set of wires having approximately the same electrical length may be reduced. According to another embodiment, lower quality wires may be used to provide a set of wires having approximately the same electrical length. Additional details of example embodiments of the invention are described below in greater detail in conjunction with FIGS. 1B through 4.

Figure 1B:
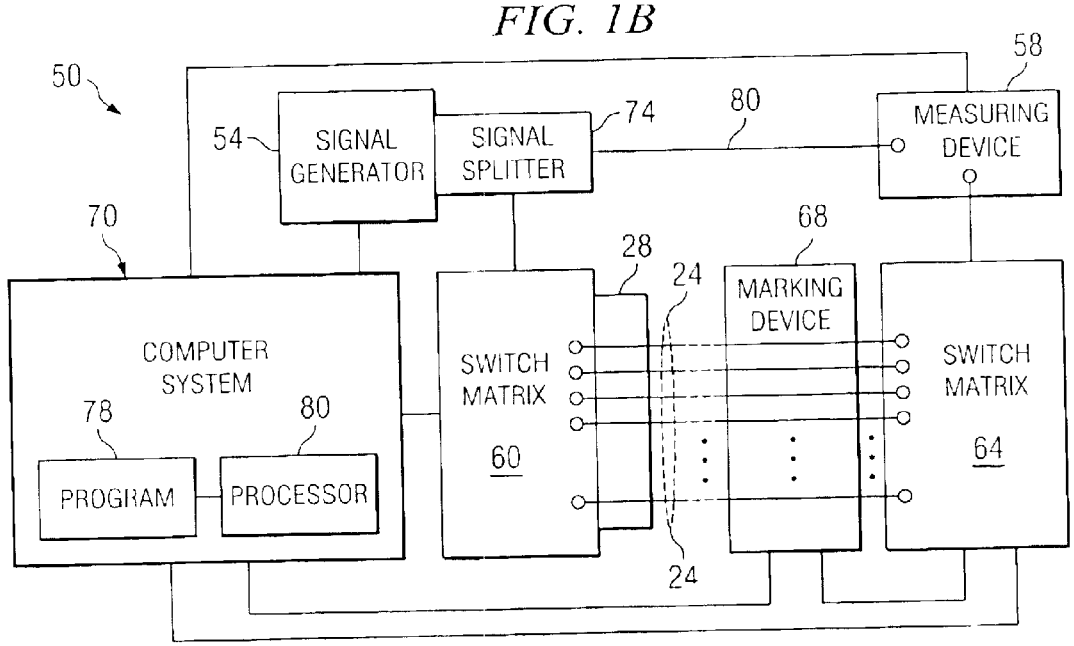
FIG. 1B is a schematic diagram illustrating one embodiment of an electrical length matching system that may be used to provide a connection assembly of the system shown in FIG. 1A.

FIG. 1B is a schematic diagram illustrating one embodiment of an electrical length matching system 50. System 50 comprises a signal generator 54, a measuring device 58, switch matrices 60 and 64, a marking device 68, and a computer system 70. Signal generator 54 may be any device operable to generate and transmit an electrical signal. In one embodiment, signal generator 54 may be coupled to a signal splitter 74 that may be used to transmit at least two signals at the same time using one signal transmitted to signal splitter 74 by signal generator 54. Any signal generator 54 that runs at a sufficient rate may be used. One example of signal generator 54 is HP8131A Pulse Generator with Option 020, available from Hewlett-Packard Corporation. Measuring device 58 may be any device operable to determine the time difference of signal arrival. Examples of measuring device 58 include an oscilloscope and a pulse counter; however, any other suitable device for determining a time difference of signal arrival may be used. One example of measuring device 58 is TEKTRONIX TDS 820 digital oscilloscope, available from Tektronix Corporation. Switch matrices 60 and 64 may be any device that may switch the path of a signal from one path to another path. For example, switch matrices 60 and 64 may each have a bus (not explicitly shown in FIG. 1B) that may be controlled by computer system 70. Marking device 68 is any device operable to indicate a location where a wire 24 has a particular electrical length. For example, marking device 68 may visually indicate the location using a light, such as a light emitting diode. Additional details of marking device 68 are described below in conjunction with FIGS. 3A and 3B. Computer system 70 comprises a program 78 and a processor 80. Program 78 comprises a set of instructions for electrical length tuning that may be performed by computer system 70. Additional details of computer system 70 are described below in conjunction with FIG. 2.

Signal generator 54 is coupled to measuring device 58 over a reference wire 80. Reference wire 80 may be an actual piece of wire having a reference electrical length. Reference wire 80 may also be an adjustable delay line that allows an operator to select the electrical length for each assembly. The respective physical lengths of wires 24 being tuned are adjusted to have the same electrical length as reference wire 80. In one embodiment, signal generator 54 is coupled to reference wire 80 through signal splitter 74; however, signal splitter 74 may be omitted in some embodiments. Signal generator 54 is also coupled to switch matrix 60. In one embodiment, signal generator 54 is coupled to switch matrix 60 through signal splitter 74. Measuring device 58 is coupled to switch matrix 64. Switch matrix 60 is coupled to switch matrix 64 over wires 24 and marking device 68. In one embodiment, signal matrix 60 may be coupled to wires 24 over connector 28; however, in some embodiments, connector 28 may be omitted from system 50. In one embodiment, reference wire 80 may be omitted and one of wires 24 may be used as a reference wire.

Computer system 70 is coupled to signal generator 54, measuring device 58, switch matrix 64, and marking device 68.

In operation, computer system 70 executes program 78 using processor 80 to perform electrical length matching of wires 24. In one embodiment, computer system 70 may tune wires 24 to have the same electrical length as reference wire 80 using signal generator 54, measuring device 58, switch matrices 60 and 64, and marking device 68. When executed on processor 80, in one embodiment, program 78 is operable to direct signal generator 54 to generate a signal and transmit the signal to signal splitter 74. Signal splitter 74 splits the received signal and sends one signal to measuring device 58 over reference wire 80 and another signal to measuring device 58 over switch matrix 60, a selected wire 24, and switch matrix 64. Program 78 directs switch matrix 60 to select a particular wire 24 as a path to transmit the signal received from signal splitter 74 and also directs switch matrix 64 to receive the signal over the selected wire 24. When measuring device 58 receives the signals over reference wire 80 and the selected wire 24, respectively, measuring device 58 determines the time difference between the arrival of the two signals.

After determining the time difference, measuring device 58 transmits the determined time difference to computer system 70. Using the determined time difference, program 78 is operable to determine the location along the length of the wire 24 where the wire has the same electrical length as the electrical length of reference wire 80. Program 78 is operable to indicate the determined location along the wire 24 using marking device 80.

In one embodiment, signal splitter 74 may be directly attached to switch matrix 60 to minimize the error introduced by the distance between signal splitter 74 and switch matrix 60. In one embodiment, program 68 may determine the location along the length of wire 24 where the wire 24 has the reference electrical length by dividing the determined time difference of a signal arrival by a known time delay value of wires 24 and 80. In one embodiment, program 78 may also indicate, using marking device 68, the corresponding pin number of the tunes wire 24. Program 78 is operable to do this because program 78 selects the particular wire 24 to be tuned using switch matrices 60 and 64.

Once the location along the length of wire 24 is determined, program 78 performs the process again for another selected wire 24. This is repeated until all of wires 24 are tuned to have the same electrical length as reference wire 80. In one embodiment, each wire 24 may be coupled to its own signal generator and measuring device. In such an embodiment, switch matrices may be omitted and wires 24 may be tuned at the same time.

Figure 2:
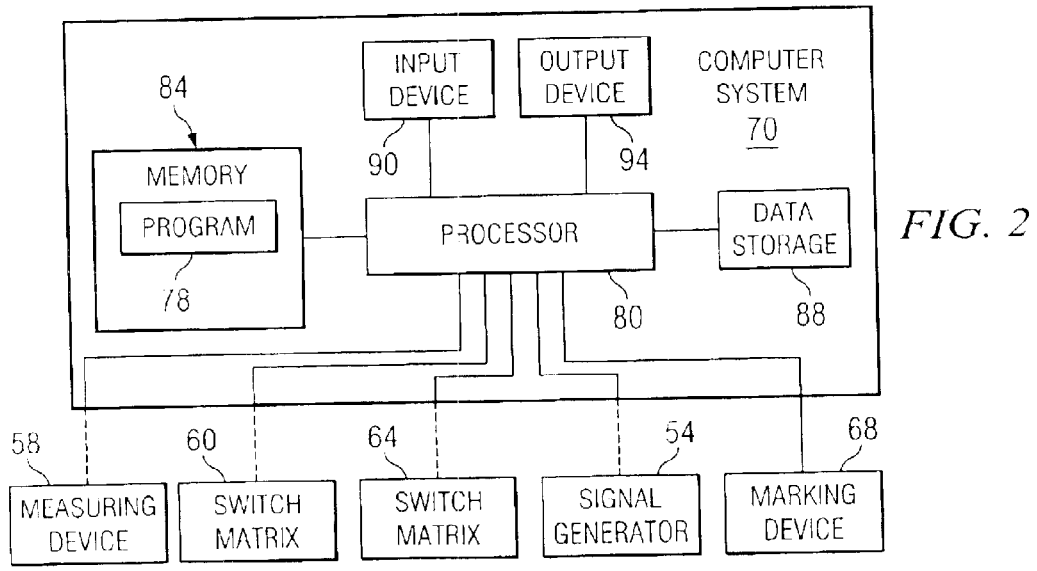
FIG. 2 is a schematic diagram illustrating a computer system that may be used in conjunction with the electrical length matching system shown in FIG. 1B.

FIG. 2 is a schematic diagram illustrating one embodiment of computer system 70 shown in FIG. 1B. Computer system 70 comprises processor 80, memory 84 storing electrical length matching program 78, one or more data storage units 88, an input device 90, and an output device 94. Processor 80 is coupled to memory 84, data storage unit 88, input device 90, and output device 94. Processor 80 is operable to execute the logic of program 78 and access data storage unit 88 to retrieve or store data related to program 78. Examples of processor 80 are Pentium™ processors, available from Intel Corporation.

Program 78 is a computer program that controls system 50 shown in FIG. 1B for tuning wires to have the same electrical length. Program 78 may reside in any storage medium, such as memory 84 or data storage unit 88. Program 78 may be written in any suitable computer language, including C or C++.

Memory 84 and data storage unit 88 may comprise files, stacks, databases, or other suitable forms of data. Memory 84 and data storage unit 88 may be random access memory, read only memory, CD ROM, removable memory devices, or any other suitable devices that allow storage and/or retrieval of data. Memory 84 and storage unit 88 may be interchangeable and may perform the same functions. Input device 90 may be any device operable to provide input from a user to system 70. Examples of input device include a keyboard, a mouse, and a microphone. Output device 94 may be any device operable to communicate information generated by system 70 to a user. Examples of output device 94 include a monitor, printer, and a speaker.

Figure 3A:
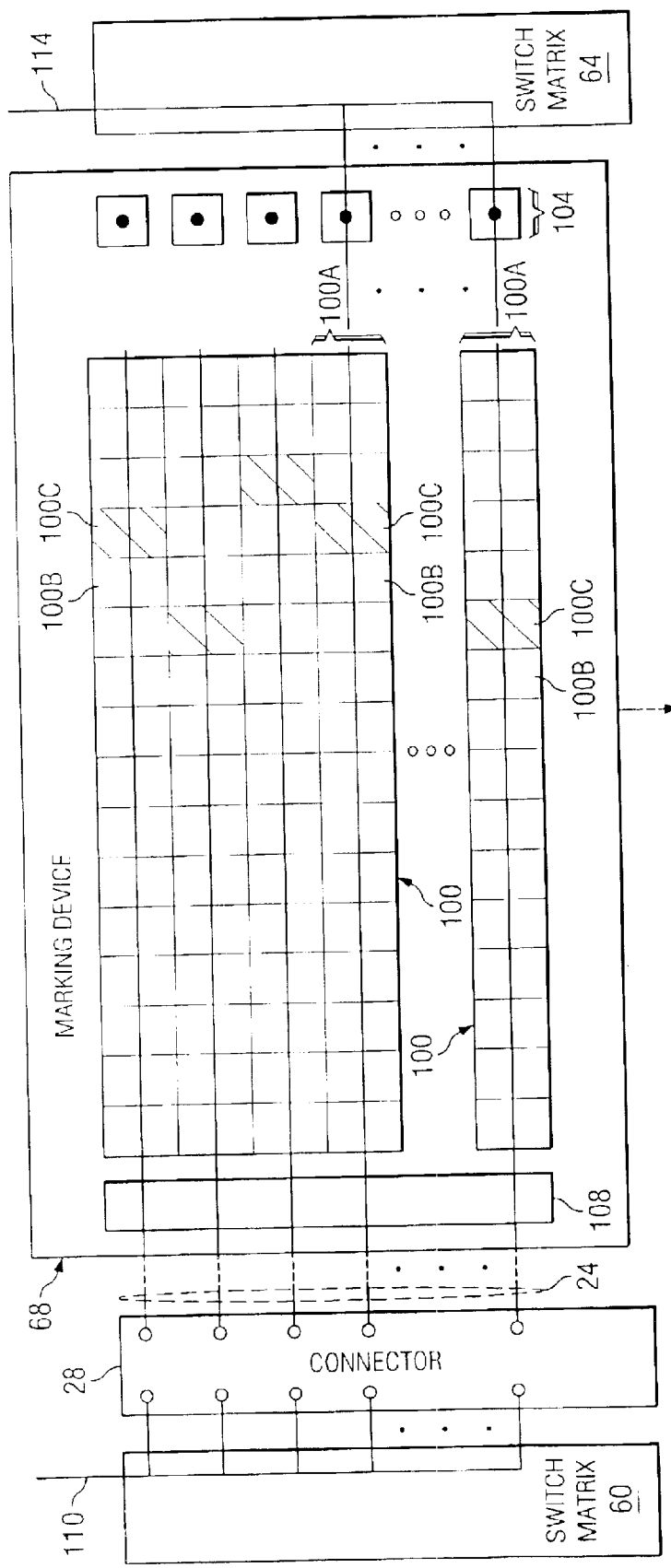
FIG. 3A is a top view of one embodiment of a marking device shown in FIG. 1B.
Figure 3B:
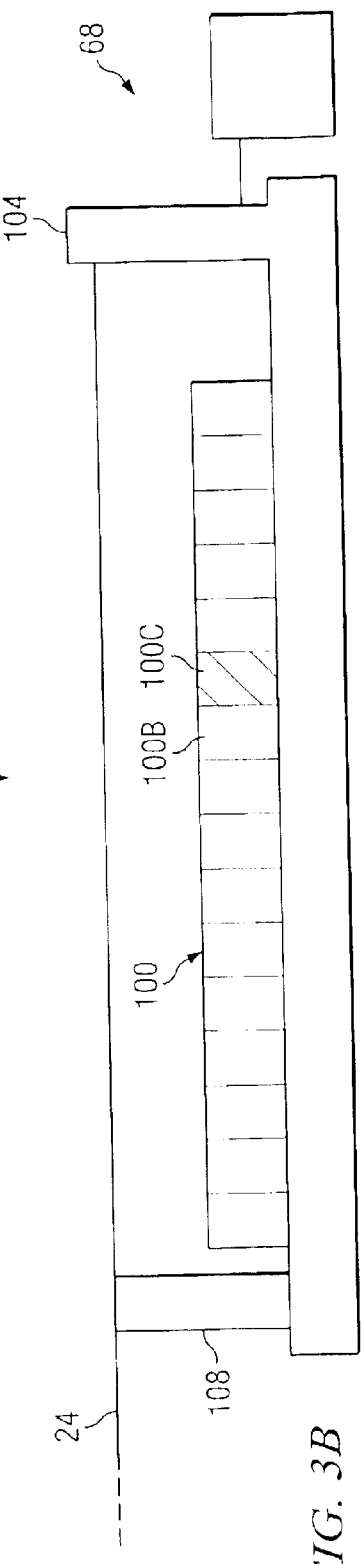
FIG. 3B is a side view of the marking device shown in FIG. 3A.

FIG. 3A is a top view of one embodiment of marking device 28 shown in FIG. 1B. FIG. 3B is a side view of one embodiment of marking device 28 shown in FIG. 1B. FIGS. 3A and 3B are described jointly. As shown in FIGS. 3A and 3B, marking device 68 comprises a plurality of lights 100 and connectors 104 positioned on a platform 106. Lights 100 are arranged in rows 100A that run along the length of wire 24, in one embodiment. Lights 100 may be any visual indicator, such as light emitting diodes, incandescent light bulbs, and liquid crystal displays. Any electrical and non-electrical visual indicators may be used as light 100 and are referred to herein as light 100. The size of each light 100 may depend on the margin of error for the electrical lengths of wires 24 that may be tolerated by the specific performance requirements of a system that may incorporate the wires 24. The length of each light 100 along the length of each wire 24 may be shorter as the required precision for the electrical length increases. In one example, for a 50-foot cable, each light 100 may be approximately ⅛th of an inch in length along the length of a wire. Connectors 104 may be any connector that may be used to electrically couple wires 24 to marking device 68. An example of connector 104 is a punch down block. In one embodiment, a transparent shield that is cut-resistant may be positioned over lights 100. An example of a shield includes Plexiglas.

Each wire 24 is positioned over a particular row 100A of lights 100. In one embodiment, a wire guide 108 may be used for positioning each wire 24 over light row 10A. Using the determined time difference and the time delay values of wires 24, program 78 determines the location where wire 24 has a desired electrical length and may initiate an activation of a particular light 100 that corresponds to the determined location so that a technician may sever the wire 24 at the indicated location. As shown in FIG. 3A, activated lights 100 are indicated as lights 100C, whereas non-activated lights 100 are indicated as lights 100B. After determining the location for the desired electrical length, program 78 directs switch matrices 60 and 64 to switch to a next wire 24 by selecting paths of buses 110 and 114 that correspond to the next wire 24. In one embodiment, wires 24 may be connected to switch matrix 60 using connector 28 that may be used to couple wires 24 to devices 14 or 18. This may be advantageous in some embodiments of the invention because connector 28, which is the connector that is used in the actual implementation of system 10, is already coupled to one end of each wire 24, which reduces the manufacturing time and cost of system 10 shown in FIG. 1A.

FIG. 4 is a flow chart illustrating one embodiment of a method 150 of electrical length matching. Some or all of acts associated with method 150 may be performed using program 78. Method 150 starts at step 154. At step 158, a reference wire and wires to be tuned are provided. At step 160, a reference signal and a test signal are transmitted over the reference wire and the test wire, respectively. Any device or combination of devices may be used to transmit the reference signal and the test signal at step 160. Examples of these devices include signal generators and signal splitters. At step 164, the time difference between arrival of the reference signal and the test signal is determined at a destination. In one embodiment, the time difference may be determined using a measuring device such as an oscilloscope or a pulse counter. At step 168, a location along the length of the tuned wire where the wire has approximately the same electrical length as the reference wire is determined. At step 170, an indication of the location is provided. At step 174, the wire is severed at the location. In one embodiment, the wire may be severed manually; however, the wire may also be severed automatically by a cutting device that is controlled by computer system 70. Where an automated cutting device is used, step 170 may be omitted and computer system 70 may position the cutting device to the location determined at step 168 for the severing of the wire.

At decision step 178, whether there is a wire that has not been tuned is determined. If yes, then "yes" branch is followed to step 160. If "no," then "branch" is followed to step 180. In some embodiments, steps 174 and 178 may be omitted. Method 150 stops at step 180.

In one embodiment of step 160, the reference signal and the test signal are transmitted at substantially the same time. The signals may be transmitted at the same time using a signal splitter or using multiple signal generators that are calibrated to transmit the signals at the same time. In one embodiment, method 150 may also include a step of indicating the pin position of each wire that is tuned.

Although some embodiments of the present invention have been described in detail, it should be understood that various changes, substitutions, and alterations can be made hereto without departing from the spirit and scope of the invention as defined by the appended claims.

What is claimed is:

1. A computerized method for electrical length matching, comprising:
   providing a reference wire and a plurality of wires to be tuned, each of the wires positioned substantially parallel to a corresponding particular array of light emitting devices; and
   for each of the wires to be tuned,
      transmitting a reference signal and a test signal over the reference wire and the wire, respectively, to a measuring device and determining the time difference between arrival of the respective signals at the measuring device, wherein the reference signal and the test signal are transmitted at the same time;
      determining, using a computer and the time difference, a location along the length of the wire where the wire has an electrical length that is substantially equal to the electrical length of the reference wire; and
      initiating, by the computer, a visual indication of the location along the length of the wire by activating at least one of the light emitting devices in the particular array corresponding to the wire.

2. The computerized method of claim 1, and further comprising, for each of the wires, severing the wire at the determined location.

3. The computerized method of claim 1, and further comprising indicating, by the computer, a pin location associated with the each of the wires.

4. The computerized method of claim 1, and further comprising positioning a shield between the plurality of wires and the corresponding particular arrays of light emitting devices, wherein the shield is at least partly transparent and cut-resistant.

5. The computerized method of claim 1, wherein determining a location along the length of the wire comprises dividing the determined time difference by a time delay value of the wire.

6. A computerized method for tuning a wire to have a particular electrical length, comprising:
   providing a reference wire and the wire to be tuned;
   transmitting a reference signal and a test signal over the reference wire and the wire, respectively, to a destination and determining the time difference between duration of travel of the respective signals to the destination; and
   providing, based on the time difference, an indication of the location along the length of the wire where the wire has an electrical length approximately equal to the electrical length of the reference wire.

7. The computerized method of claim 6, wherein transmitting a reference signal and a test signal comprises transmitting, at the same time, the reference signal and the test signal.

8. The computerized method of claim 6, wherein the destination is an oscilloscope.

9. The computerized method of claim 6, wherein determining the location comprises dividing the time difference by a time delay value of the wire.

10. The computerized method of claim 6, and further comprising severing the wire at the location.

11. The computerized method of claim 6, and further comprising indicating, by the computer, a pin location associated with the wire.

12. The computerized method of claim 6, wherein the indication is a visual indication.

13. A system for tuning a wire to have the same electrical length as a reference wire, comprising:
   a computer system having a processor;
   a computer readable medium coupled to the computer system, the computer readable medium comprising a program operable, when executed on the processor, to:
      initiate a transmission of a reference signal and a test signal over the reference wire and the wire to be tuned, respectively, from a signal generator to a destination;
      determine the time difference between duration of travel of the respective signals to the destination; and
      provide, based on the time difference, an indication of the location along the length of the wire where the wire has an electrical length approximately equal to the electrical length of the reference wire.

14. The system of claim 13, wherein the reference signal and the test signal are transmitted at the same time.

15. The system of claim 13, and further comprising:
   a signal generator coupled to the computer system, the signal generator operable to generate a signal in response to a command from the computer system; and
   a signal splitter coupled to the signal generator, the signal splitter operable to receive the signal from the signal generator and split the signal into the reference signal and the test signal;
   wherein the signal splitter is coupled to the destination by the reference wire and the wire to be tuned.

16. The system of claim 13, wherein the destination is an oscilloscope, and further comprising the oscilloscope coupled to the computer system.

17. The system of claim 13, wherein the program is operable to provide an indication of the location by dividing the time difference by a time delay value of the wire.

18. The system of claim 13, and further comprising a display device coupled to the computer system, wherein the display device comprises a row of lights and at least one wire guide operable to guide at least a portion of the wire into a position that is parallel to the row of lights, the display device operable to visually indicate the location along the length of the wire.

19. The system of claim 13, and further comprising:
   a signal generator coupled to the computer system, the signal generator operable to generate a signal in response to a command from the computer system;
   a signal splitter coupled to the signal generator, the signal splitter operable to receive the signal from the signal generator and split the signal into the reference signal and the test signal;
   a measuring device coupled to the computer system and the signal splitter by the reference wire and the wire to be tuned, the measuring device operable to determine the time difference between arrival of the respective signals at the destination and to send the determined time difference to the computer system; and
   a display device coupled to the computer system, the display device having a row of lights and at least one wire guide operable to guide at least a portion of the wire into a position that is parallel to the row of lights.

20. The system of claim 19, wherein the program is further operable to indicate a pin location associated with the wire.

* * * * *

UNITED STATES PATENT AND TRADEMARK OFFICE
CERTIFICATE OF CORRECTION

PATENT NO. : 6,844,741 B2 Page 1 of 1
APPLICATION NO. : 10/370877
DATED : January 18, 2005
INVENTOR(S) : Carl Edward McGaha It is certified that error appears in the above-identified patent and that said Letters Patent is hereby corrected as shown below:

<u>Column 6:</u>
Line 6, after "24 over light row" delete "10A" and insert -- 100A -- .

Signed and Sealed this

Twenty-first Day of November, 2006

JON W. DUDAS
*Director of the United States Patent and Trademark Office*